Jan. 16, 1968 M. J. PRUCHA 3,364,465

METHOD FOR TUNING INDUCTIVE LOOP VEHICLE DETECTORS

Filed Feb. 12, 1962 2 Sheets-Sheet 1

INVENTOR.
MARTIN JOHN PRUCHA

BY: Edward A. Robinson
ATTORNEY

METHOD FOR TUNING INDUCTIVE LOOP VEHICLE DETECTORS

Filed Feb. 12, 1962 2 Sheets-Sheet 2

3,364,465
Patented Jan. 16, 1968

3,364,465

METHOD FOR TUNING INDUCTIVE LOOP VEHICLE DETECTORS

Martin John Prucha, Palo Alto, Calif., assignor to General Precision, Inc., Binghampton, N.Y., a corporation of Delaware Filed Feb. 12, 1962, Ser. No. 172,620
4 Claims. (Cl. 340—38)

ABSTRACT OF THE DISCLOSURE

A vehicle presence detector system having a loop oscillator, a reference oscillator, and a mixer for generating a difference frequency is tuned by shifting the frequency of the reference oscillator by a predetermined increment, adjusting the loop oscillator to obtain a minimum response of the difference frequency, and thence returning the reference oscillator to the normal frequency thereof.

This invention relates to the tuning of apparatus for sensing the presence of a motor vehicle, a railroad vehicle or the like, and more particularly, this invention relates to the tuning in the field of such apparatus including an oscillator, the output frequency of which is affected by the introduction of the metallic mass of the vehicle into a magnetic field established by an inductive loop that is in the electrical circuit of the oscillator.

Inductive loop presence detecting systems have been disclosed and claimed by a co-pending patent application, Ser. No. 95,236 entitled "Inductive Loop Presence Detector" filed by Robert A. Kleist and John Scarbrough on Mar. 13, 1961; now Patent No. 3,164,802 and by another co-pending application, Ser. No. 129,342 entitled, "Vehicle Presence Detector" filed on Aug. 4, 1961, now Patent No. 3,205,352 by the inventor of the instant application. Both of said co-pending patent applications are assigned to the same assignee as the instant application. These applications disclose arrangements for sensing vehicles wherein inductive loops are electrically connected into oscillator circuits such that the inductive value determines the frequency of oscillation. The frequency of each loop oscillator may be compared with the frequency of a corresponding reference oscillator to obtain a difference or beat frequency. If the frequency of the loop oscillator varies slightly with respect to that of the reference oscillator, the difference or beat frequency will vary considerably, and may be utilized for generating an output signal indicative of the presence of a vehicle within the field of the loop.

An object of this invention is to provide an improved presence detector system using a filter for selectively passing the beat frequency signals generated by a comparison of the signals of the loop oscillator and the reference oscillator, and more particularly, it is an object to provide a method and means for tuning a loop oscillator to a minimum response point of the filter such that the loop oscillator may be tuned in the field with a minimum of test equipment.

Numerous other objects and advantages will be apparent throughout the progress of the specification which follows. The accompanying drawings illustrate a certain selected embodiment of the invention and the views therein are as follows.

Figure 1:
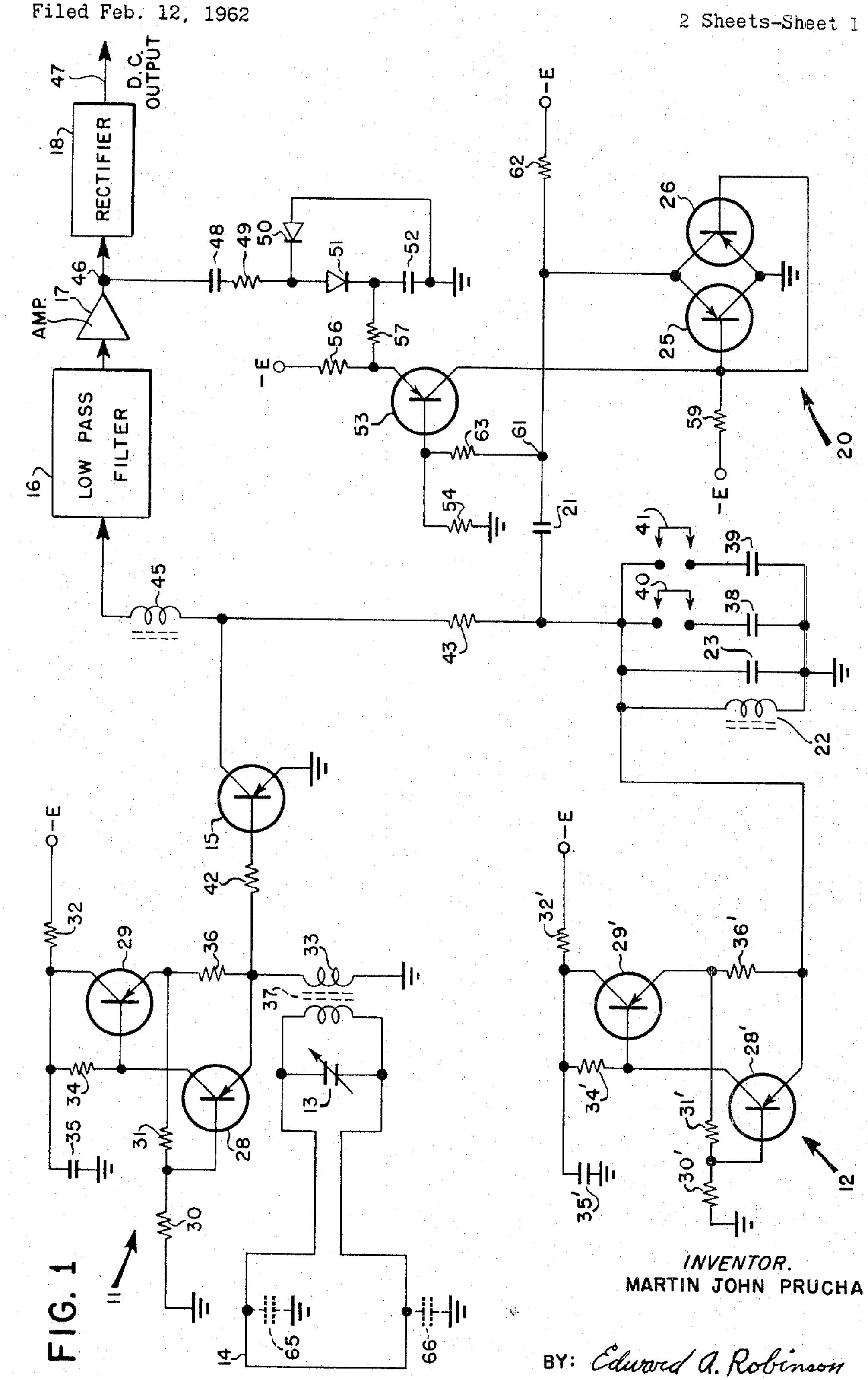
FIGURE 1 is a circuit diagram of the presence detector system which may be tuned in the field by the method of this invention.

The vehicle detector system includes two similar oscillator circuits 11 and 12. The frequency of oscillation of the circuit 11 is determined by a tuned circuit including a capacitor 13 and an inductive loop 14, which may be a single turn or electrical conductor embedded in the paving of a traffic lane of a street or placed around or between the rails of a railroad track. A magnetic field is established by the loop 14 and the inductive value of the loop will be decreased when the metallic mass of a vehicle enters the field of the loop. The loop oscillator 11 generates a signal of a frequency determined by the inductive value of the loop 14, which signal is combined with a signal from the reference oscillator 12 by a difference frequency detector including a transistor 15. A low pass filter 16 will pass the difference signal when no vehicle is in the field of the loop, but will reject the difference signal which increases in frequency when a vehicle enters the field of the loop. The difference signal is amplified and rectified by the circuits 17 and 18 to provide a direct current output signal. A transistor switch 20 becomes conductive when the signal from the amplifier 17 falls off and a capacitor 21 is effectively shunted across a resonant circuit including an inductance 22 and a capacitor 23 whereby the frequency of the reference oscillator is decreased somewhat. The decrease in frequency of the reference oscillator further increases the difference frequency generated by the transistor 15 and causes a hysteresis effect such that the presence detector system becomes partially self-sustaining and is stabilized.

The loop oscillator 11 includes two transistors 28 and 29. The first transistor 28 is essentially a grounded base amplifier, and the second transistor 29 is essentially an emitter follower. The base electrode of the transistor 28 is coupled to a biasing network including resistors 30 and 31. The resistor 31 provides a negative feedback path for stabilizing the circuit. A resistor 32 and a capacitor 35 provide an RC network for coupling the negative potential, —E, of a power supply to both transistors 28 and 29 while providing a shunt path to ground for alternating currents. A resistor 34 constitutes a load impedance for the transistor 28, and the base electrode of the transistor 29 is directly connected thereto. A resistor 36 constitutes a load impedance for the transistor 29 and provides a positive feedback path to sustain oscillation between the transistors 28 and 29. The frequency of the oscillations is determined by a resonant circuit including the inductive loop 14 and the capacitor 13 which is coupled to the positive feedback path via a transformer 37. The resonant circuit 13–14 and transformer 37 provide a shunt path to ground which is of relatively low impedance for all frequencies except the resonant frequency. Therefore, the positive feedback through the resistor 36 will be of the frequency corresponding to the high impedance shunt path of the tuned circuit 13–14. The resonant frequency of the circuit 13–14 is dependent only upon the inductive and capacitive values of the elements therein. The inductive value of a loop has been found to be essentially constant regardless of changes in environment conditions. To stabilize and render the oscillator circuit insensitive to environmental changes and particularly to changes in ground moisture, the circuit is arranged such that the value of the loop inductance and the value of the capacitor 13 will pre-dominate, and the effect of the other factors such as stray capacitance will be minimized. The means for minimizing the effect of stray capacitance of the loop will be discussed subsequently. Changes in ground conductance will not affect the inductance value of the loop although such changes may cause variation in the "Q" value. However, the oscillator 11 is insensitive to the Q of the resonant circuit 13–14, and therefore, variation in the Q will not affect the oscillator frequency.

The reference oscillator 12 is a nearly identical circuit to the loop oscillator 11, and the circuit components thereof shown in FIGURE 1 are identified by reference numerals having prime marks, but otherwise corresponding to the numerals of the circuit 11. The circuit 12 differs from the circuit 11 in that the inductance winding 22 and the capacitor 23 constitute the tuned circuit corresponding to the loop 14 and the capacitor 13 of the oscillator 11, and the tuned circuit 22–23 is directly connected to the emitter electrode of the transistor 28' whereas a transformer coupling 37 is employed in the oscillator 11. As will be described subsequently, additional capacitors 38 and 39 may be connected in parallel with the capacitor 23 by jumper connections 40 and 41.

The difference or beat frequency generating circuit includes the grounded emitter transistor 15 having one of the oscillators coupled to the base electrode thereof via a resistor 42 and having the other oscillator coupled to the collector electrode via another resistor 43. Since the base electrode of the transistor 15 is not coupled to a direct potential source, this transistor conducts during alternate half cycles of the input wave from the oscillator 11, and therefore, the operation is class B such that both radio frequencies are mixed and produce an envelope wave which is the difference frequency. Both R.F. signals together with the audio difference signal will appear at the collector electrode of the transistor 15. A radio frequency choke coil 45 attenuates the R.F. oscillator signals and passes the envelope or beat frequency which is equal to the difference between the frequencies of the two oscillators. The difference frequency is normally such as to pass the low pass filter 16, and will appear at a point 46 at the output of the amplifier 17. The audio frequency is rectified by the circuit 18 to provide a direct current level at an output terminal 47. The circuit 17 may be a conventional audio amplifier, and the circuit 18 may be a conventional diode bridge rectifier.

The audio wave normally appearing at the point 46 is passed by an RC network including a capacitor 48 and a resistor 49 to a voltage doubler rectifying circuit including two diodes 50 and 51. A positive potential will appear as a charge on a capacitor 52 when a wave appears at the point 46. A transistor 53 is normally conductive, the base electrode thereof being coupled to ground reference potential by a resistor 54, and the emitter electrode being coupled to the positive charge of the capacitor 52 by a potential dividing network including resistors 56 and 57. When the low pass filter blocks signals therethrough, no signals will appear at the point 46, and capacitor 52 will become discharged eliminating the positive bias and causing the transistor 53 to be rendered non-conductive by the negative bias of the reference potential, —E.

The transistor switch 20 includes a pair of transistors 25 and 26 which are normally non-conductive whereby the capacitor 21 is isolated from the ground reference potential. Both the base electrodes of the transistor 25 and 26 are normally biased positively through conduction of the transistor 53. However, during times when the difference signal is rejected by the low pass filter 16, the transistor 53 becomes non-conductive whereupon the base electrodes of the transistors 25 and 26 are biased negatively via a resistor 59, and both transistors will be rendered conductive.

The capacitor 21 couples the alternating signal from the reference oscillator 12 to a point 61 which is normally isolated from ground since the transistors 25 and 26 are non-conductive. It may be noted that the transistors 25 and 26 are connected essentially in parallel, but with one transistor inverted with respect to the other. The two base electrodes are connected together and to a common biasing control transistor 53, but the collector electrode of one transistor is connected to the emitter electrode of the other transistor in each case and the two emitter-collector electrode combinations are coupled between the point 61 and the ground reference potential. When the transistors 25 and 26 are biased into conduction, the alternating wave from the oscillator 12 is passed by a capacitor 21 through the transistors 25 and 26 to the ground reference potential. Alternate half cycles of the wave are of opposite polarity, and a single transistor connected between the point 61 and ground would conduct nonsymmetrically since the saturation impedance of a transistor is related to the amplification characteristic, $\beta$, and the $\beta$ characteristics of transistors are considerably different when the emitter and collector electrodes are interchanged. During the positive lobes or half cycles of the alternating wave, the transistor 26 will conduct with substantially no impedance while the transistor 25, being reversed, will conduct but will offer some degree of impedance to current flow. During the negative half cycles of the wave, the transistor 25 will be fully conductive while the transistor 26 will offer some impedance. Thus, it may be appreciated that during the positive excursions of the alternating wave, the transistor 26 will provide a primary path to ground, and during the negative excursions, the transistor 25 will provide a primary conduction path. Therefore, the combination of the two transistors inverted with respect to each other will provide a good conduction path for the alternating wave regardless of the instantaneous polarity thereof. This inverted transistor arrangement 25–26 constitutes an effective switching means for alternating currents.

Alternatively, a symmetrical transistor could be used in place of the two transistors 25 and 26. A symmetrical transistor is commercially available and includes a base electrode of one type semiconductor between two symmetrical electrodes of the opposite type semi-conductor. With this type of transistor the emitter electrode and the collector electrode are interchangeable and the amplification factor, $\beta$, is the same regardless of which of the side electrodes is used as an emitter and which as a collector. However, the cost of a special purpose, symmetrical transistor is greater than the cost of two ordinary transistors connected as indicated by transistors 25 and 26 in FIGURE 1.

As described heretofore, the tuned circuit including the capacitor 13 and the loop 14 is coupled into the loop oscillator 11 by the transformer 37 which provides a ground connection required by the oscillator circuit 11 while isolating the loop 14 from ground. The loop 14 is an insulated copper wire laid on or embedded in the ground, and a certain amount of stray capacitance exists between the wire and the surrounding ground. In FIGURE 1, capacitors 65 and 66 are not elements connected into the circuit, but exist because the loop 14 is a metallic conductor physically lying on or embedded within the surface or street paving, etc. The existence of the stray capacitance 65–66 is not detrimental in itself because the capacitor 13 may be adjusted to compensate for the capacitance 65–66 and to cause the circuit 11 to oscillate at the proper frequency. The capacitors 65–66 are shown connected to opposite sides of the loop 14 which is a good approximation to the actual distributed capacitance. Since there is no actual ground connection, the loop is balanced and from an electrical standpoint the capacitance 65 on one side of the loop is in series with the capacitance 66 on the other side—the two capacitances in series are shunted across the capacitor 13. While the existence of the capacitances 65 and 66 is not detrimental, any changes or variance in this capacitance may be very detrimental. Such changes may come about because of changing environmental conditions and particularly because of changes in the moisture content of the ground wherein the loop 14 is installed. Thus, the capacitances 65–66 may substantially increase during a rain storm and may cause variation in the tuning of the loop oscillator. To minimize the variation of the stray capacitance, the effect of the capacitance itself should be minimized. It is desirable that no actual ground connection should exist at one side or the other of the loop to maintain two capacitances 65 and 66 in series, rather than establishing a single capacitance effectively across the loop. It is further desirable that the loop be of a minimum number of turns, and actual loop installations have proven satisfactory wherein the loop is but a single turn. In this case, the stray capacitance 65–66 is minimized and the effect of changes therein are not detrimental to the operation of the loop oscillator 11. Indeed, it has been found that the transformer 37 may have a turns ratio on the order of 3:1 to permit the use of a single turn loop to minimize the effect of the stray capacitance. In the event that a multiple turn loop is found to be necessary, the several conductors required may be encased within a single water proof cable covering or sheath. This arrangement will minimize changes in the stray capacitance between the turns of the loop, and the primary change in stray capacitance will be between the several conductors considered as a whole and the surrounding ground.

Figure 2:
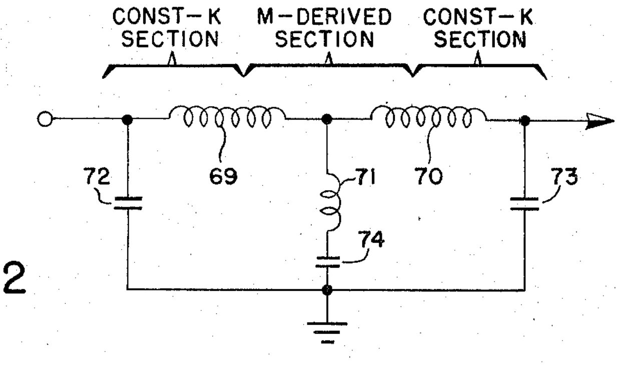
FIGURE 2 is a circuit diagram of a low pass filter which was shown as a block in FIGURE 1.
Figures 3A, 3B, 3C:
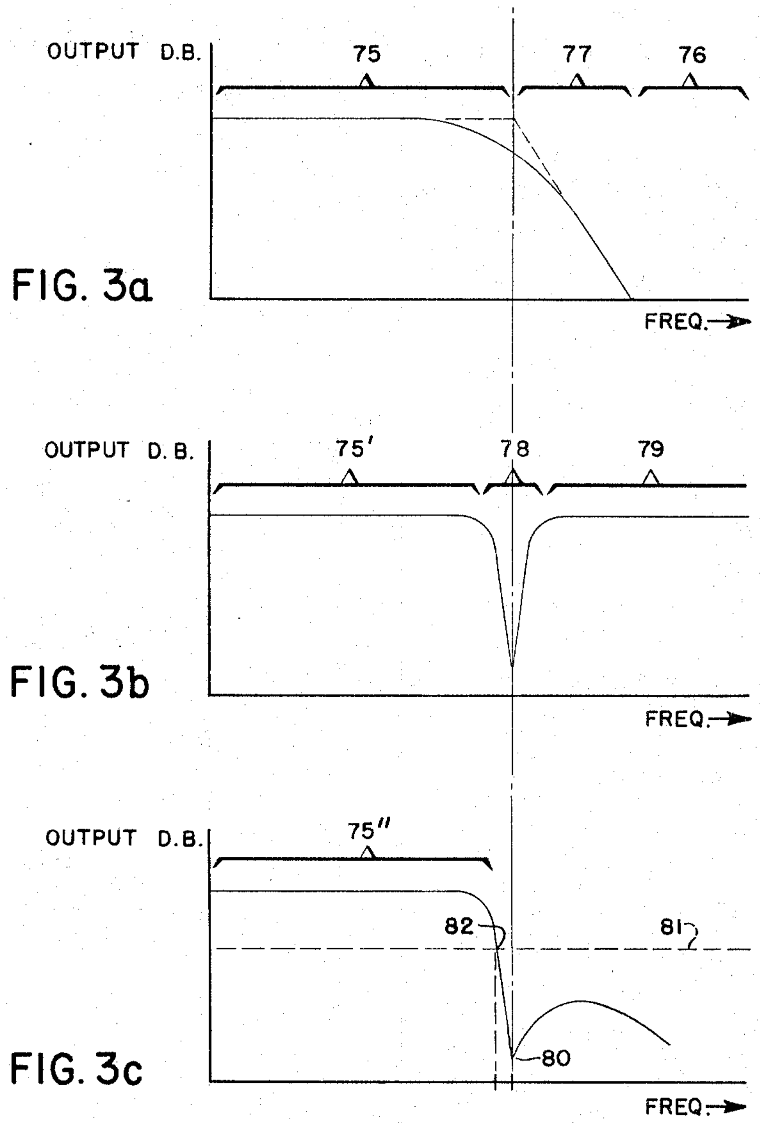
FIGURES 3*a*, 3*b* and 3*c* are graphical representations of the response characteristics of the low pass filter illustrated in FIGURE 2.

The low pass filter 16 includes three inductive windings 69, 70 and 71 and three capacitors 72, 73 and 74 as shown in FIGURE 2. A portion of the inductance 69 together with the capacitor 72 constitutes one half of a constant K filter section, and similarly, a portion of the inductance 70 together with the capacitor 73 constitutes another half of a constant K filter section. The remainder of the inductance 69, the remainder of the inductance 70, the inductance 71, and the capacitance 74 constitute an M derived filter section. FIGURE 3*a* shows the response characteristic for a constant K low pass filter. This characteristic provides a pass band 75 for the lower frequency signals and a rejection band 76 for higher frequency signals. Between the pass band 75 and the rejection band 76 lies a band 77 wherein the signal response in decibels decreases linearly as the frequency increases. Since the response characteristic of an ideal low pass filter would have a low frequency pass band, and a sharp cut off followed by a high frequency rejection band, the constant K filter fails as an ideal filter because the cut-off is not sharp but is gradual in the region 77.

FIGURE 3*b* shows the response characteristic of an M derived filter. This filter section provides a low frequency pass band 75′, a narrow rejection band 78, and a high frequency pass band 79. The M derived filter may be sharply tuned such that the rejection band is narrow and the response cuts off sharply from the pass band into the rejection band. The sharp cut off of the M derived section is combined with the low pass and high rejection bands of the constant K section to provide a combined response curve as shown in FIGURE 3*c*. The combined characteristic includes a low frequency pass band 75″ corresponding to both pass bands 75 and 75′ of the constant K and M derived sections. As the frequency is increased beyond the pass band, the response cuts off sharply due to the sharp cutoff characteristic of the M derived section. A minimum response band or "notch" 80 also results from use of the M derived section. As the frequency increases from the minimum response point 80, the output response will increase slightly but not sufficiently to cause switching in the presence detector circuits. It may be appreciated that the combination of the constant K sections with the M derived sections provides a low pass filter having a uniform pass band for low frequencies and a sharp cut off to the minimum response point 80.

As shown in FIGURE 3*c* the switching level 81 may be established as six db below the normal response of the pass band 75″, and is therefore set at approximately .5 of the full response of the filter. The minimum point 80 would have a zero response if the M derived filter section could include ideal circuit elements. However, with actual circuit elements available, the minimum point 80 may be 30 db down from the pass band level 75″. As the frequency increases beyond the minimum point 80, the response level rises somewhat to a value of −20 db which is obviously well below the six db switching level 81.

In an exemplary embodiment of this invention, a presence detector system has been constructed wherein the loop oscillator is tuned to 90 kilocycles with no vehicle present in the field of the loop. The reference oscillator 12 is normally tuned to a frequency of 87.25 kilocycles, and under these conditions, a beat frequency of 2,750 cycles (90 kc.–87.25 kc.) is generated by the difference frequency detector 15, and is passed by the low pass filter 16 and the power amplifier 17. When the metallic mass of a vehicle enters the field of the loop 14, the frequency of the loop oscillator is caused to shift to a value in excess of 92.5 kilocycles whereby a beat frequency greater than 5,250 cycles will be generated by the difference frequency generator 15. The frequency of 5,250 cycles corresponds to the −6 db level of the filter indicated by a point 82 on the characteristic curve of FIGURE 3*c*. At this level the transistor switch 20 will effectively close and couple the capacitor 21 in parallel with the capacitor 23 of the reference oscillator 12. The reference oscillator 12 is thereby shifted in frequency from 87.25 kc. to 85.25 kc. and the beat frequency will increase to 7,250 cycles which is well in excess of the switching point 82. Therefore, when the threshold value is reached, a positive switching action will occur and the system will be partially self-sustaining to hold the system and prevent an immediate reverse switching. Similarly, when the metallic mass is removed from the loop, the loop oscillator will again return to a 90 kc. output signal whereupon the beat frequency will be reduced to 4,750 cycles. Since the 4,750 cycles is definitely below the switching frequency of 5,250 cycles, the transistor switch 20 will open and decouple the capacitor 21 from the resonant or tank circuit of the oscillator 12 whereby the output from the reference oscillator 12 will return to the normal value of 87.25 kc. It may be appreciated that a hysteresis effect is introduced by causing the reference frequency to shift slightly when switching action occurs to prevent unstable or relay chatter conditions from occurring.

The reference oscillator may be assembled and pretuned in manufacture, however, the loop oscillator may not be completely assembled and may not be tuned at the factory because the inductive loop 14 must be installed at a field location, and thence connected into the oscillator circuit. Obviously, each installation may be somewhat different and the inductive value of the loop can not be pre-determined to permit a pre-tuning of the oscillator 11. Therefore, the capacitor 13 may be adjusted as indicated in FIGURE 1 to facilitate a final field tuning of the loop oscillator 11 after the installation is completed. To further facilitate the tuning of the loop oscillator, a capacitor 38 may be coupled into the resonant circuit of the oscillator 12 by a jumper connection 40, and the reference oscillator will be caused to shift to a lower frequency output. In the exemplary embodiment discussed above, the capacitor 38 is of a value of 3,000 mmf., and causes the oscillator to shift to a frequency of 84.25 kc. Since the low pass filter 16 provides a minimum point or notch frequency 80 equal to 5,750 cycles, the loop oscillator may then be tuned to a minimum response from the low pass filter 16 and amplifier 17. This minimum response characteristic, corresponding to the notch point 80, FIGURE 3*c*, is easily identifiable with minimum apparatus. For example, a simple voltmeter coupled to the output terminal 47 could provide the necessary indication of minimum response as the capacitor 13 is adjusted under field conditions. Alternatively, a pair of head phones may be coupled to the output of the amplifier 17 to provide an audible indication of minimum response as the capacitor 13 is varied. With the reference frequency shifted to 84.25 kc. by the capacitor 38, the loop oscillator frequency must be tuned to 90 kc. to achieve the minimum response at the 5,750 cycle point 80 of the response curve (FIGURE 3*c*). Thus, it may be appreciated that the reference oscillator which was pretuned at the factory, and the notch characteristic 80 of the low pass filter 16 may be used in the field for tuning the loop oscillator 11 using a minimum of field equipment.

The sensitivity of the vehicle presence detector system may be increased somewhat by adding further capacitance to the resonant circuit of the reference oscillator 12. FIGURE 1 shows an additional capacitor 39 which may be coupled in parallel with the principal capacitor 23 by means of a jumper connection 41. The addition of the capacitor 39 to the resonant circuit causes the frequency of the reference oscillator 12 to decrease somewhat thereby increasing the beat or difference frequency generated by the transistor 15. With an increased beat frequency, the threshold level of the low pass filter 16 is more closely approached, and therefore, the loop oscillator 11 will be more critical in operation. The presence detector system with the additional capacitance 39 coupled into the reference oscillator 12 will be more sensitive to vehicles which may approach the field of the loop 14. The amount of capacitance 39 which may be added for the purpose of increasing the sensitivity of the system must be limited by considerations of the stability of the system. Obviously, if the threshold level of the low pass filter were too closely approached, spurious or false switching actions may result from slight deviations from the normal frequency by either of the oscillators 11 or 12. In the exemplary embodiment described above, the vehicle presence sensing apparatus included several small capacitors 39 which could be introduced into the circuit by jumper connections as indicated at 41 such that the sensitivity of the system could be adjusted in the field, and a fair compromise between good sensitivity and good stability may be obtained.

Changes may be made in the form, construction and arrangement of the parts without departing from the spirit of the invention or sacrificing any of its advantages and the right is hereby reserved to make all such changes as fall fairly within the scope of the following claims.

The invention is claimed as follows:

1. A method for tuning a first oscillator in a vehicle presence detector system having two oscillators and a means for deriving a difference frequency signal therefrom, said method comprising shifting the frequency of the second oscillator by connecting additional capacitance into a tuned circuit therein, impressing the difference frequency signals upon a low pass filter having a point of minimum response characteristic, adjusting the parameters of the first oscillator for a minimum response signal from the filter, and removing the additional capacitance from the resonant circuit of the second oscillator.

2. A method for tuning a loop oscillator in a vehicle presence detector system having a loop oscillator, a reference oscillator and a means for deriving a difference signal therefrom, said method comprising shifting the frequency of the reference oscillator by coupling additional capacitance into a tuned circuit therein, impressing the difference signals upon a low pass filter including an M derived section for providing a frequency response characteristic having a minimum response point, adjusting the capacitive value of the tuned circuit of the loop oscillator for a minimum response signal from the filter, and removing the additional capacitance from the resonant circuit of the reference oscillator to restore the reference oscillator to a pre-tuned frequency.

3. A method for tuning a vehicle presence detector system having two oscillators and a means for deriving a difference frequency signal therefrom, said method comprising:

installing an inductive loop at a desired field location beneath a path for vehicles;

electrically connecting the inductive loop to a first of the oscillators of the vehicle presence detector system;

connecting a reactance element to the second oscillator to cause the second oscillator to shift in frequency by a pre-determined increment;

impressing the difference frequency upon a filter having a characteristic including a low frequency pass band, a high frequency rejection band, and a point of minimum response;

adjusting the first oscillator while monitoring the signal passed by the filter such that the first oscillator will be tuned to provide a difference signal of a frequency corresponding to the minimum response point of the filter; and removing the reactance element from the second oscillator.

4. A method for tuning a vehicle presence detector system having a loop oscillator, a reference oscillator and a means for generating a difference frequency signal, said method comprising:

pre-tuning the reference oscillator;

installing an inductive loop at a desired location under rails of a railroad track;

electrically coupling the inductive loop to the loop oscillator of the vehicle presence detector system;

shifting the frequency of the reference oscillator by coupling additional capacitance into a tuned circuit therein;

impressing the difference signals upon a low pass filter including an M derived section for providing a frequency response characteristic having a minimum response point;

adjusting the capacitive value of the tuned circuit of the loop oscillator for a minimum response signal from the filter; and removing the additional capacitance from the resonant circuit of the reference oscillator to restore the second oscillator to a pre-tuned frequency.

References Cited

UNITED STATES PATENTS

| | | | |
|---|---|---|---|
| 2,343,987 | 3/1944 | Lindsay et al. | 331—65 X |
| 2,393,717 | 1/1946 | Speaker | 324—3 X |
| 2,442,805 | 6/1948 | Gilson | 324—3 X |
| 2,917,732 | 12/1959 | Chase et al. | 340—258 |
| 3,103,655 | 9/1963 | Jones | 340—258 |
| 2,505,754 | 5/1950 | Combs | 325—433 |
| 2,606,285 | 8/1952 | Bataille | 325—433 |
| 2,679,005 | 5/1954 | Bataille | 331—39 |
| 3,205,352 | 9/1965 | Prucha | 340—258 X |

THOMAS B. HABECKER, *Acting Primary Examiner.*

NEIL C. READ, *Examiner.*

A. H. WARING, *Assistant Examiner.*